United States Patent
Chen et al.

(10) Patent No.: US 7,304,500 B2
(45) Date of Patent: Dec. 4, 2007

(54) PROGRAMMABLE LOGIC MODULE AND UPGRADE METHOD THEREOF

(75) Inventors: Tzu-Shern Chen, Hsinchu (TW); Chun-Hsien Lin, Tainan (TW); Ming-Chief Chaw, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 165 days.

(21) Appl. No.: 10/748,963

(22) Filed: Dec. 29, 2003

(65) Prior Publication Data

US 2005/0144584 A1   Jun. 30, 2005

(51) Int. Cl.
*H01L 25/00* (2006.01)
*H03K 19/177* (2006.01)
*G06F 17/50* (2006.01)

(52) U.S. Cl. .............................. 326/41; 326/37; 326/47; 716/16

(58) Field of Classification Search ............ 326/37–41, 326/47, 101, 102
See application file for complete search history.

(56) References Cited

U.S. PATENT DOCUMENTS

| | | | | |
|---|---|---|---|---|
| 5,887,145 A | * | 3/1999 | Harari et al. ............... | 710/301 |
| 6,028,319 A | * | 2/2000 | Tsai ....................... | 250/559.34 |
| 6,031,391 A | * | 2/2000 | Couts-Martin et al. ....... | 326/38 |
| 6,259,271 B1 | * | 7/2001 | Couts-Martin et al. ....... | 326/40 |
| 6,337,579 B1 | * | 1/2002 | Mochida ...................... | 326/41 |
| 6,507,213 B1 | * | 1/2003 | Dangat ........................ | 326/38 |
| 6,567,518 B1 | * | 5/2003 | Weir .......................... | 379/333 |
| 6,759,870 B2 | * | 7/2004 | Cliff et al. .................... | 326/41 |
| 6,876,228 B2 | * | 4/2005 | Sunaga et al. ................ | 326/40 |
| 6,893,268 B1 | * | 5/2005 | Harari et al. ................. | 439/43 |
| 6,917,219 B2 | * | 7/2005 | New .......................... | 326/41 |
| 2003/0230799 A1 | * | 12/2003 | Yee et al. .................... | 257/706 |
| 2005/0222300 A1 | * | 10/2005 | Ikezawa et al. ............. | 523/457 |

* cited by examiner

*Primary Examiner*—Rexford Barnie
*Assistant Examiner*—Dylan White
(74) *Attorney, Agent, or Firm*—Winston Hsu

(57) ABSTRACT

A programmable logic module. In the programmable logic module, a first printed circuit board has a socket and a downloading unit. A field programmable gate array (FPGA) is disposed on the first printed circuit board. A nonvolatile memory stores program codes for programming the field programmable gate array. The nonvolatile memory is soldered to a second printed circuit board with a plurality of pins corresponding to the socket, and the second printed circuit board is plugged into the socket of the first printed circuit board. The nonvolatile memory downloads program codes thereof to the field programmable gate array by the downloading unit.

7 Claims, 4 Drawing Sheets

PROGRAMMABLE LOGIC MODULE AND UPGRADE METHOD THEREOF

BACKGROUND OF THE INVENTION

1. Field of the Invention

The present invention relates to a logic module, and more particularly, to a programmable logic module and upgrade method thereof.

2. Description of the Related Art

Programmable logic devices such as FPGAs have wide applicability due to their flexibility and reprogrammability. An FPGA typically includes an array of configurable logic blocks (CLBs) connected across a configurable routing structure for implementing desired logic functions and circuit design. Thus, the FPGA occupies a larger area on the wafer surface. FPGAs also include a number of configuration memory cells coupled to the CLBs to specify the function to be performed by each CLB, and a number of configuration memory cells coupled to the configurable routing structure to specify the connectivity between CLBs.

FPGAs are most commonly used within systems including a microprocessor and a memory unit. As shown in FIG. 1, an available FPGA 120 receives a configuration bitstream from memory device 100 upon receipt of a program signal from microprocessor 110, to erase previous configuration data and receive new configuration data from memory device 100. Thus, the FPGA 120 can implement new logic functions and circuit designs according to new configuration data.

FIG. 2 shows a conventional FPGA module. The FPGA module has a circuit board with a FPGA 18, a downloading unit 12, and a memory device 16 disposed thereon. The memory device 16 is plugged into a socket 14 on the circuit board 10. The configuration data stored in the memory device 16 is written into the FPGA by the downloading unit 12. When FPGA gate count is increased and the desired functions and circuits are more complex, a memory device with a larger storage capacity is required. The conventional memory device 16, however, is formed within a dual-in-line package (DIP), the maximum storage capacity of which is only 8 Mb. Thus, DIP memory 16 in the conventional FPGA module limits the upgrade capacity of the FPGA 18.

FIG. 3 shows another conventional FPGA module. This FPGA module has a circuit board 30 with an FPGA 38 disposed thereon, a downloading unit 32, and a plurality of memory devices 36. The memory devices 36 are plugged into the circuit board 30 through the corresponding sockets 34. Configuration data stored in the serial memory devices 36 is written into the FPGA 38 by the downloading unit 32. As shown in FIG. 3, the circuit board 30 has eight memory sockets 34 to receive the memory devices 36. Typically, serial memory devices have slow write speed, and are expensive. Additional, when FPGA gate count is increased and the desired functions and circuits are more complex, a memory device with a larger storage capacity is required. A new circuit board with more sockets is necessary when the eight serial memory devices cannot sufficient to store the desired configuration data. Thus, the FPGA 38 of the conventional FPGA module has limited the upgrade capacity.

Further, the FPGAs 18 and 38 shown in FIGS. 2 and 3 both have a plurality of I/O terminals and power terminals, each of the I/O terminals and power terminals is connected to a corresponding pin (20 or 40) on the circuit board 10 and 30. Insertion force between the pins (20 and 40) of the FPGA and the corresponding connector (not shown), however, increases with increased pin count. Thus, it is inconvenient to insert or remove the FPGA from the connector.

SUMMARY OF THE INVENTION

It is therefore an object of the present invention to enable upgrade of an FPGA to increase the storage capacity of the memory device in the programmable logic module.

Another object of the present invention is to decrease insertion force between the pins of the programmable logic module and the corresponding connector.

According to the above mentioned object, the present invention provides a programmable logic module capable of enabling upgrade of an FPGA to increase the storage capacity of the memory device.

In the programmable logic module, a first printed circuit board has a socket and a downloading unit. A field programmable gate array (FPGA) is disposed on the first printed circuit board. A nonvolatile memory stores program codes for the field programmable gate array. The nonvolatile memory is soldered on a second printed circuit board with a plurality of pins corresponding to the socket, and the second printed circuit board is plugged into the socket on the first printed circuit board. The nonvolatile memory downloads program codes thereof to the field programmable gate array by the downloading unit.

According to the above mentioned object, the present invention also provides a programmable logic module capable of decreasing the insertion force between the pins and the corresponding connector.

In the programmable logic module, a first printed circuit board has a power pin region and a plurality of I/O pin regions. The power pin region is separated from the I/O pin regions, and each power pin region and I/O pin region has a plurality of pins. A field programmable gate array is disposed on the first printed circuit board. The field programmable gate array has a plurality of power terminals and I/O terminals. A nonvolatile memory stores program codes for the field programmable gate array. Each I/O terminal of the field programmable gate array is electrically connected to a corresponding pin in the I/O pin region. All power terminals of the field programmable gate array are electrically connected to pins in the power pin region. The pins in the power pin region and the I/O pin region are connected to external circuits through different connectors.

According to the above mentioned object, the present invention also provides a method of upgrading a programmable logic module.

In this method, the second printed circuit board with nonvolatile memory is removed from the socket on the first printed circuit board. Next, the second printed circuit board with the nonvolatile memory is disposed on a writer to write a new program into the nonvolatile memory. The second printed circuit board with nonvolatile memory is then plugged back into the socket. Finally, the new program stored in the nonvolatile memory is downloaded to the field programmable gate array by the downloading unit.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 1:
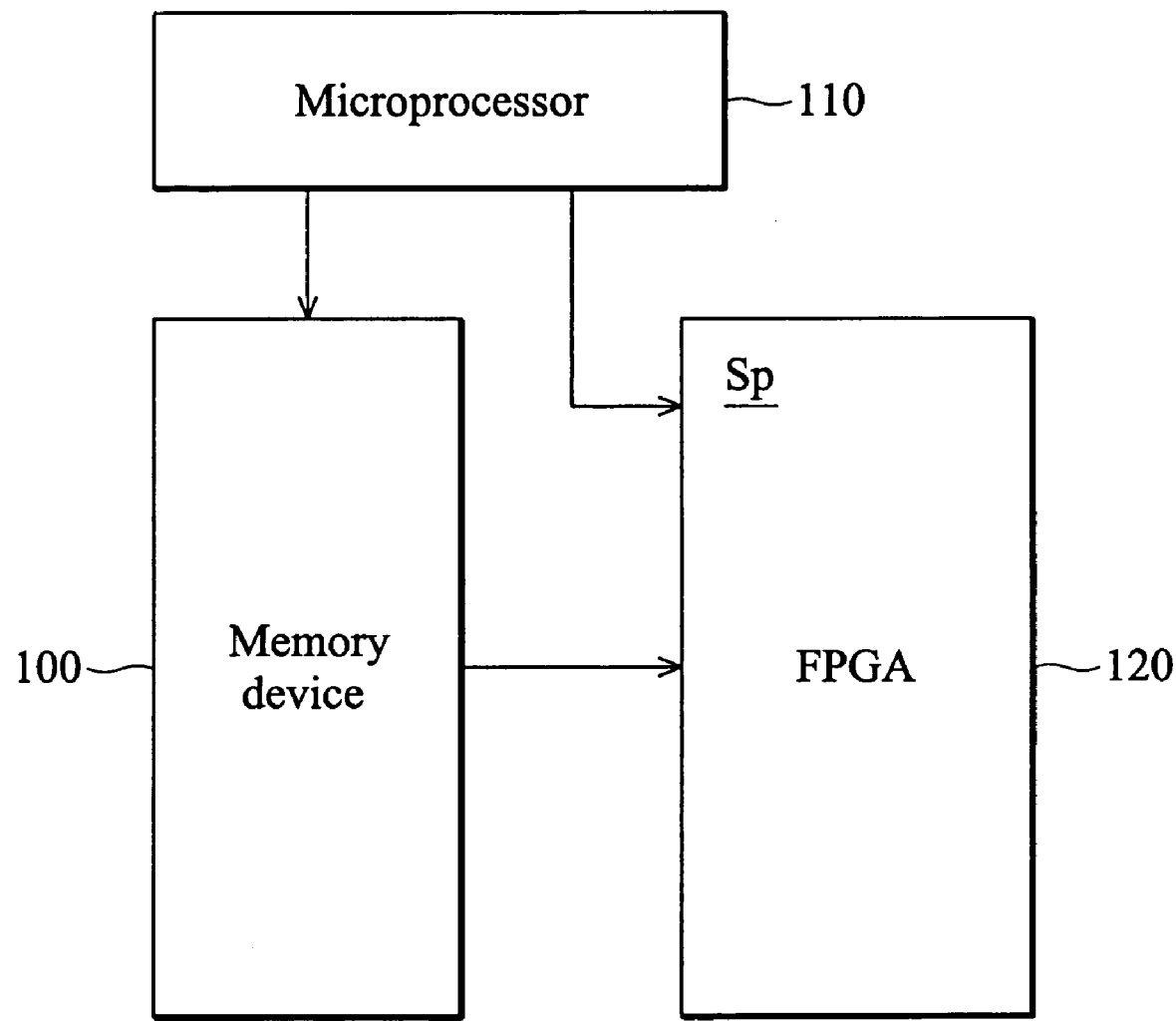
FIG. 1 is a diagram of a conventional FPGA module.
Figure 2:
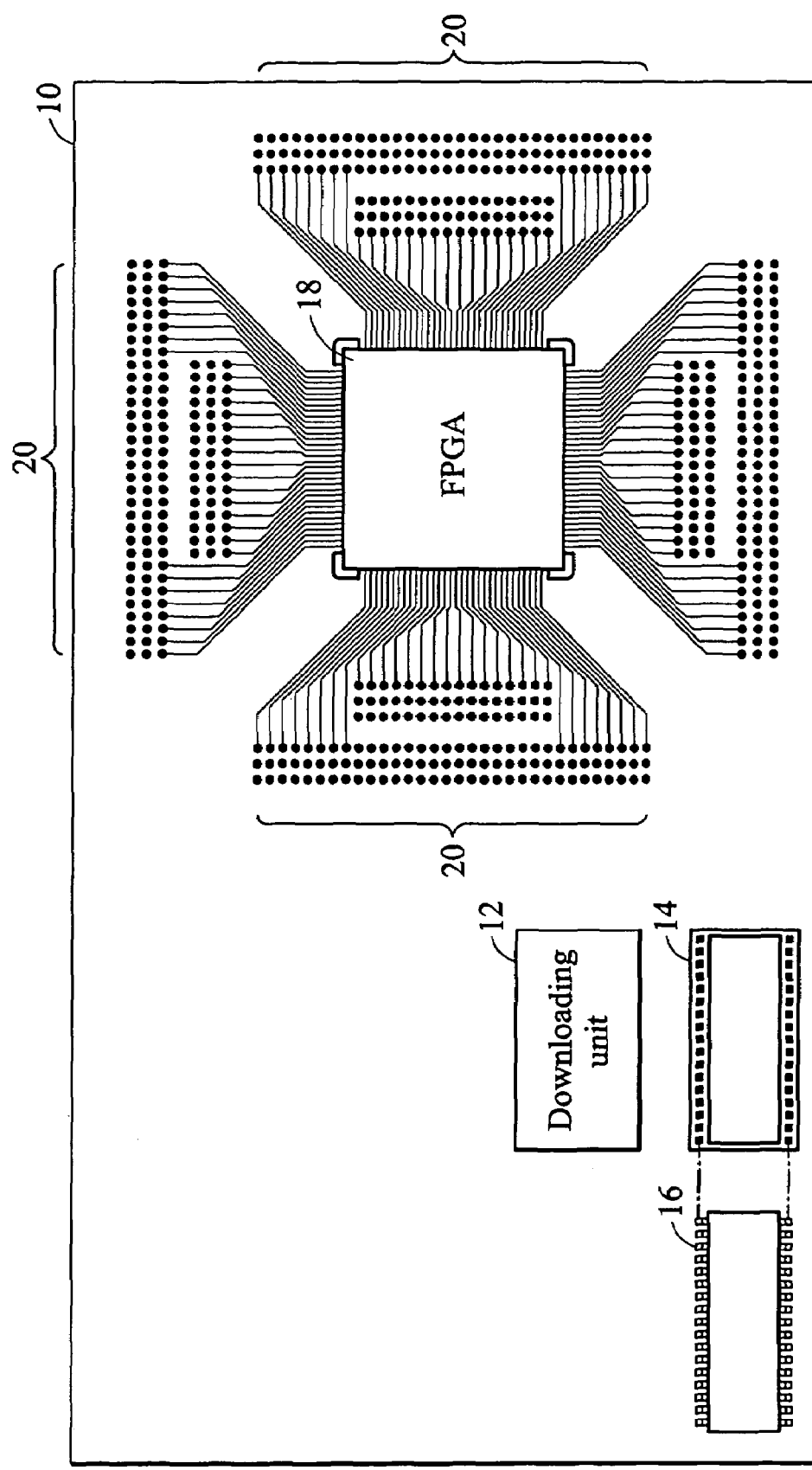
FIG. 2 is a diagram showing another conventional FPGA module.
Figure 3:
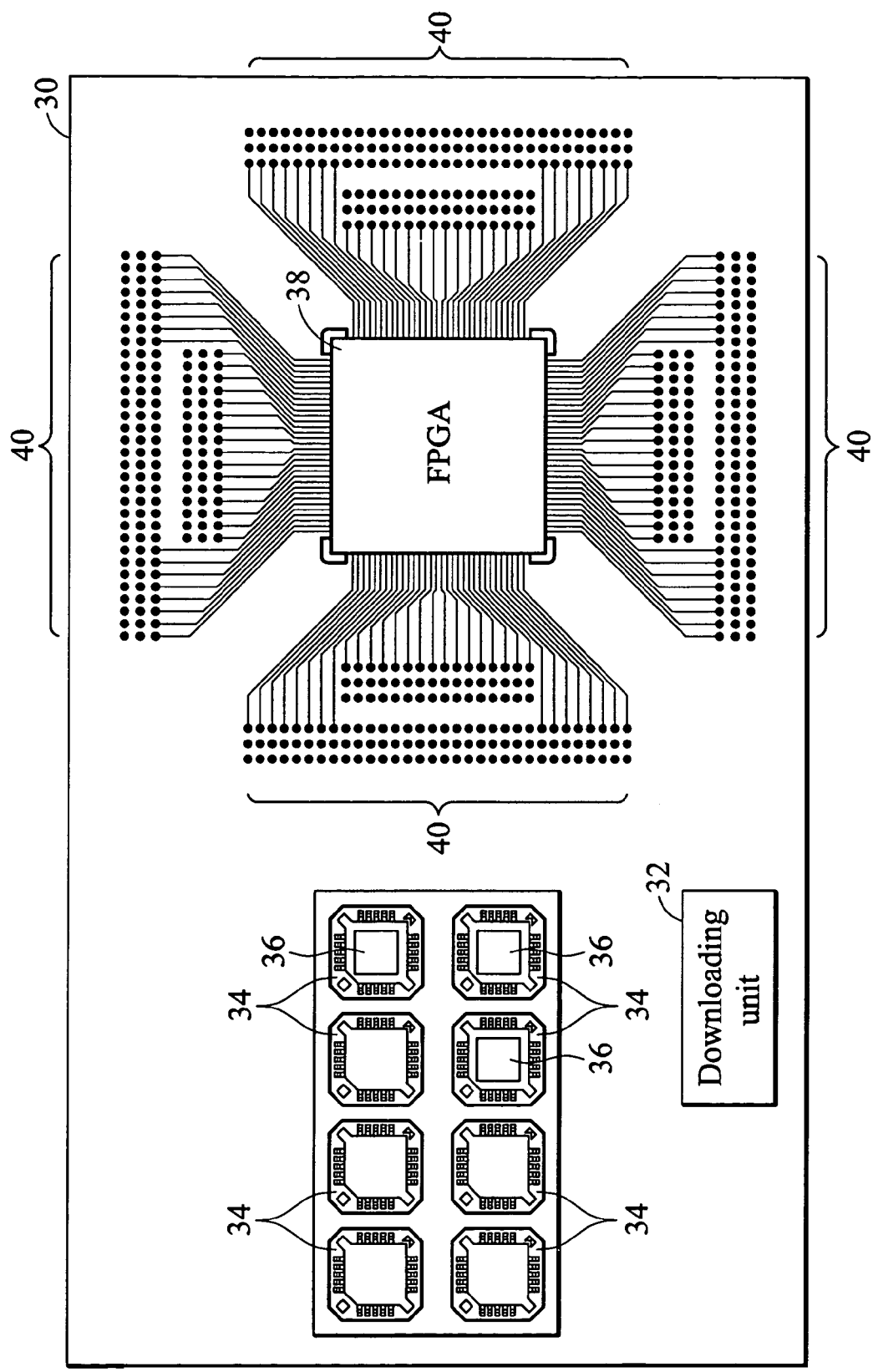
FIG. 3 is a diagram showing another conventional FPGA module.
Figure 4:
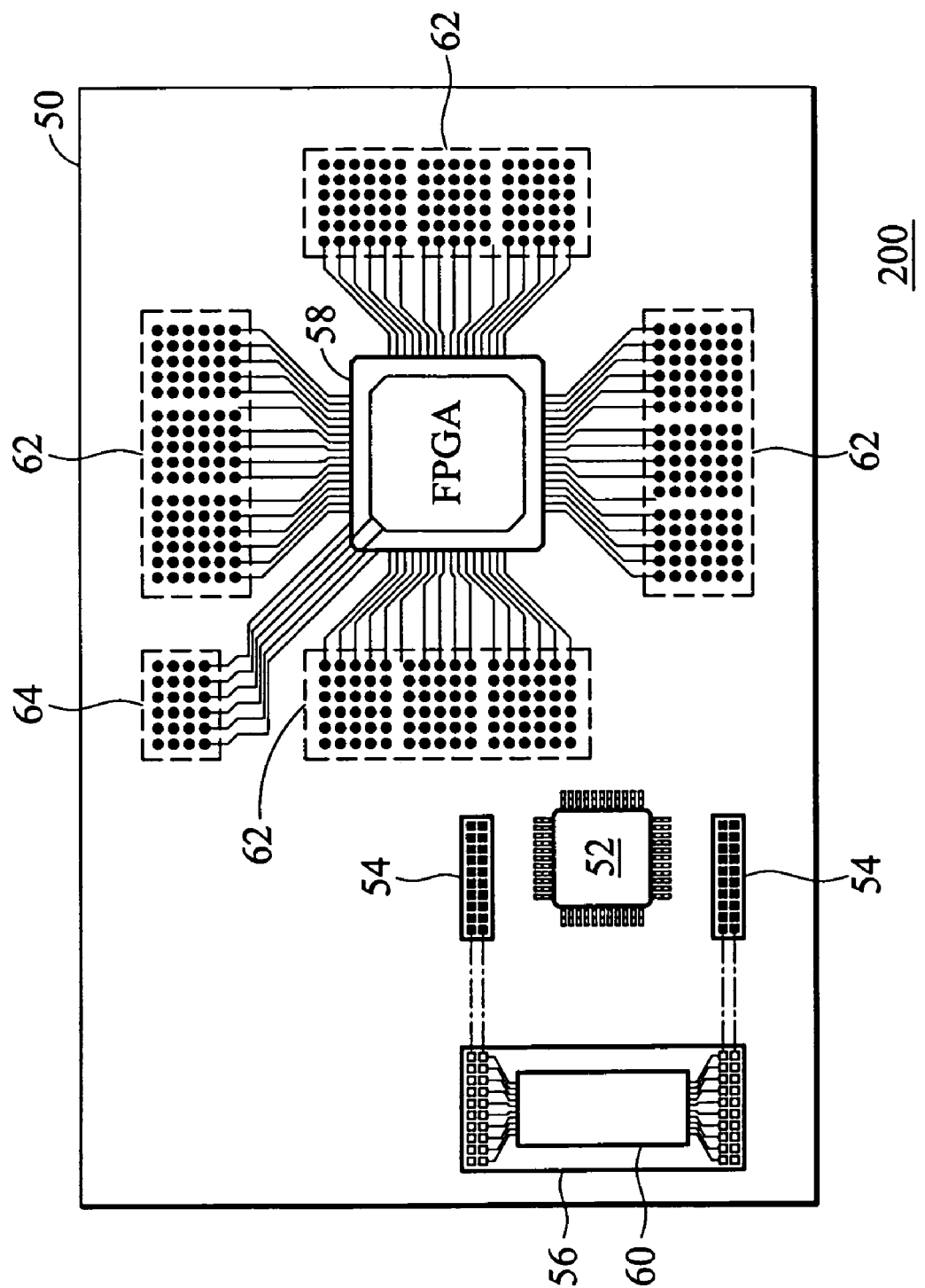
FIG. 4 is a diagram of the programmable logic module according to the prestent invention.

FIG. 4 is a diagram of the programmable logic module according to the present invention. In the programmable logic module 200, a first printed circuit board 50 has a downloading unit 52, and a socket 54. The downloading unit 52 is electrically connected to the first printed circuit board 50. The first printed circuit board 50 has a power pin region 64 and a plurality of I/O pin regions 62. The power pin region 64 is isolated from the I/O pin regions 62 each of the power pin region 64 and the I/O pin regions 62 has a plurality of pins.

A field programmable gate array (FPGA) 58 is disposed on the first printed circuit board 50. For example, the FPGA 58 includes an array of configurable logic blocks (not shown) programmably interconnected to one another across a configurable routing structure for implementing desired logic functions and circuit design. FPGAs 58 also include a number of configuration memory cells coupled to the configurable logic blocks (CLBs) to specify the function to be performed by each CLB, and a number of configuration memory cells coupled to the configurable routing structure to specify the connectivity between CLBs.

Further, FPGA 58 also has a plurality of power terminals and I/O terminals. In this case, each I/O terminal of the FPGA 58 is electrically connected to a corresponding pin in the I/O pin region 62. All power terminals of the FPGA 58 are electrically connected to the pins in the power pin region 64. Each power pin region 64 and the I/O pin region 62 are coupled to external circuits by different connectors. Typically, conventional FPGA modules do not separate the power pins from the I/O pins, such that one connector connects an I/O pin region with power pins and I/O pins. Thus, the required insertion force between this region and connector is great. Further, the number of power terminals includes 30 percent of all FPGA terminals. In the present invention, pin count in the I/O pin region is reduced because all power terminals are electrically connected to the pins in the power pin region 64. Thus, the required insertion force between each I/O pin region 62 and the corresponding connector is reduced.

A nonvolatile memory 60 storing program codes for programming the FPGA 58, is soldered on a second printed circuit board 56. The second printed circuit board 56 has a plurality of pins corresponding to the socket 54, such that the second printed circuit board can be plugged into the socket 54. In this case, the nonvolatile memory 60 can be a 128 Mb flash memory module soldered on the second printed circuit board 56 by surface mounted technology. The I/O terminals and power terminals are electrically connected to the corresponding pins of the second printed circuit board 56.

Further, to facilitate the surface mounted technology, the nonvolatile memory 60 can be packaged in a chip on board (COB) package, a small outline J-lead package, a quad flat package (QFP), plastic quad flat package (FQGP), a thin quad flat package (LQFP), a quad flat J-lead package, ball grid array (BGA) package or a fine pitch BGA package.

The program codes stored in the nonvolatile memory 60 are downloaded into FPGA 58 by a downloading unit 52, enabling FPGA 58 to implement desired functions according to the program codes downloaded from nonvolatile memory 60.

In this case, the nonvolatile memory 60 can be a 128 Mb flash memory module soldered on the second printed circuit board 56 by surface mounted technology. The capacity of the memory 60 is sufficient for program codes even when FPGA gate count increases and the desired functions are more complex. The present invention replaces only the nonvolatile memory 60 on the second printed circuit board 60 with a new memory module with larger storage capacity. Therefore, the present invention does not limit the upgrade potential of the FPGA 58, and does not require new layout for the entire programmable logic module 200.

Moreover, in the present invention, the number of pins in the I/O pin regions is reduced as all power terminals are electrically connected to the pins in the power pin region. Thus, the required insertion force between each I/O pin region and the corresponding connector is reduced, thereby increasing convenience when inserting or removing the FPGA 58.

The present invention also provides an upgrade method for a programmable logic module. The programmable logic module is shown in FIG. 4. In the upgrade method, the second printed circuit board 56 with the nonvolatile memory 60 is removed from the socket 54 on the first printed circuit board 50. Next, the second printed circuit board 60 with the nonvolatile memory 56 is disposed on a writer (not shown), for writing new program codes into the nonvolatile memory 60. The second printed circuit board 56 is then inserted into the socket 54 on the first printed circuit board 50. Thus, new program codes are stored in the nonvolatile memory 60. Finally, the new program codes are downloaded to the FPGA 58 by the downloading unit 52, enabling the FPGA 58 to implement new functions according to the new program codes downloaded from the nonvolatile memory 60.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An upgrade method for a programmable logic module, wherein the programmable logic module has a first printed circuit board with a socket, a downloading unit, a field programmable gate array and a nonvolatile memory is fixed by soldering to a second printed circuit board, and the second printed circuit is plugged into the socket, the upgrade method comprising:

removing the second printed circuit with the nonvolatile memory from the socket on the first printed circuit board;

disposing the second printed circuit with the nonvolatile memory on a writer;

writing a new program into the nonvolatile memory by the writer;

inserting the second printed circuit board with the nonvolatile memory into the socket, wherein the new program is stored in the nonvolatile memory; and downloading the new program stored in the nonvolatile memory to the field programmable gate array by the downloading unit.

2. The upgrade method as claimed in claim 1, wherein the nonvolatile memory is fixed to the second printed circuit board by surface mounted technology.

3. A programmable logic module, comprising:
- a first printed circuit board having a power pin region and a plurality of I/O pin regions, wherein the power pin region is separated from the I/O pin regions, each power pin region and I/O pin region has a plurality of pins;
- a field programmable gate array disposed on the first printed circuit board, wherein the field programmable gate array has a plurality of power terminals and I/O terminals;
- a nonvolatile memory storing program codes for programming the field programmable gate array;
- wherein each I/O terminal of the field programmable gate array is electrically connected to a corresponding pin in the I/O pin region, all power terminals of the field programmable gate array are electrically connected to pins in the power pin region, and the pins in the power pin region and the I/O pin regions are connected to external circuits through different connectors.

4. The programmable logic module as claimed in claim 3, wherein the first printed circuit board further has a socket, and the nonvolatile memory is fixed by soldering to the second printed circuit board.

5. The programmable logic module as claimed in claim 4, wherein the second printed circuit board has a plurality of pins corresponding to the socket such that the second printed circuit board is plugged into the first printed circuit board.

6. The programmable logic module as claimed in claim 4, wherein the nonvolatile memory is soldered on the second printed circuit board by surface mounted technology.

7. The programmable logic module as claimed in claim 3, wherein the nonvolatile memory is a flash memory.

\* \* \* \* \*